(12) United States Patent
Liu et al.

(10) Patent No.: US 10,290,788 B2
(45) Date of Patent: May 14, 2019

(54) SYSTEMS AND METHODS FOR MANAGING HEAT FROM AN LED

(75) Inventors: Jay Guoxu Liu, Andover, MA (US); Paul Panaccione, Newburyport, MA (US)

(73) Assignee: Luminus Devices, Inc., Woburn, MA (US)

( * ) Notice: Subject to any disclaimer, the term of this patent is extended or adjusted under 35 U.S.C. 154(b) by 767 days.

(21) Appl. No.: 12/624,729

(22) Filed: Nov. 24, 2009

(65) Prior Publication Data

US 2011/0121347 A1 May 26, 2011

(51) Int. Cl.
| | |
|---|---|
| *H01L 33/48* | (2010.01) |
| *H01L 33/64* | (2010.01) |
| *H01L 27/15* | (2006.01) |
| *H01L 29/26* | (2006.01) |
| *H01L 31/12* | (2006.01) |
| *H01L 33/00* | (2010.01) |

(52) U.S. Cl.
CPC .......... *H01L 33/641* (2013.01); *H01L 33/486* (2013.01); *H01L 2224/32225* (2013.01); *H01L 2224/48091* (2013.01); *H01L 2224/48227* (2013.01); *H01L 2224/73265* (2013.01); *H01L 2924/3025* (2013.01)

(58) Field of Classification Search
CPC ..................................................... H01L 33/00
USPC ................ 257/88, 100, 89, 99, 40, 81, 676, 257/E21.499, E21.51, E33.057, E33.058, 257/98
See application file for complete search history.

(56) References Cited

U.S. PATENT DOCUMENTS

| | | | | |
|---|---|---|---|---|
| 4,664,309 | A * | 5/1987 | Allen et al. | 228/180.22 |
| 6,313,402 | B1 * | 11/2001 | Schreiber et al. | 174/527 |
| 6,376,908 | B1 * | 4/2002 | Gaku et al. | 257/707 |
| 6,507,139 | B1 * | 1/2003 | Ishino et al. | 310/348 |
| 6,809,931 | B2 * | 10/2004 | Dove et al. | 361/707 |
| 6,831,302 | B2 * | 12/2004 | Erchak et al. | 257/87 |
| 7,105,861 | B2 | 9/2006 | Erchak et al. | |
| 7,166,871 | B2 | 1/2007 | Erchak | |
| 7,170,100 | B2 | 1/2007 | Erchak et al. | |
| 7,321,161 | B2 * | 1/2008 | Teixeira et al. | 257/675 |
| 7,598,531 | B2 | 10/2009 | Erchak et al. | |
| 7,692,207 | B2 | 4/2010 | Erchak et al. | |
| 7,993,940 | B2 | 8/2011 | Pumyea | |
| 2002/0006040 | A1 * | 1/2002 | Kamada et al. | 362/237 |
| 2004/0079957 | A1 * | 4/2004 | Andrews et al. | 257/100 |
| 2007/0010086 | A1 | 1/2007 | Hsieh | |
| 2007/0085098 | A1 | 4/2007 | Erchak et al. | |
| 2007/0211182 | A1 | 9/2007 | Erchak et al. | |
| 2007/0211183 | A1 | 9/2007 | Erchak et al. | |
| 2007/0211184 | A1 | 9/2007 | Erchak et al. | |
| 2007/0267642 | A1 * | 11/2007 | Erchak et al. | 257/98 |
| 2008/0057333 | A1 | 3/2008 | Chu et al. | |

(Continued)

FOREIGN PATENT DOCUMENTS

JP 2000150863 A * 5/2000

*Primary Examiner* — Telly D Green
(74) *Attorney, Agent, or Firm* — Wolf, Greenfield & Sacks, P.C.

(57) ABSTRACT

Light-emitting devices and particularly light-emitting device assemblies that include light-emitting diodes (LEDs) as light sources are described. The methods and systems of at least some of the embodiments described herein increase the removal of thermal energy generated by the light-emitting devices.

15 Claims, 5 Drawing Sheets

(56) References Cited

U.S. PATENT DOCUMENTS

| | | |
|---|---|---|
| 2008/0099777 A1 | 5/2008 | Erchak et al. |
| 2008/0143245 A1* | 6/2008 | Shiue ............... H01L 33/64 |
| | | 313/499 |
| 2008/0258157 A1 | 10/2008 | Wang |
| 2008/0258162 A1 | 10/2008 | Koung et al. |
| 2009/0010010 A1 | 1/2009 | Chang et al. |
| 2009/0026483 A1 | 1/2009 | Lin |
| 2009/0261375 A1* | 10/2009 | Chen et al. ............ 257/99 |
| 2009/0278162 A1* | 11/2009 | Wang et al. ........... 257/99 |
| 2010/0032705 A1* | 2/2010 | Shin et al. ............. 257/99 |
| 2010/0135611 A1* | 6/2010 | Asai et al. ............. 385/14 |
| 2010/0148210 A1* | 6/2010 | Huang et al. .......... 257/99 |
| 2010/0181589 A1* | 7/2010 | Huang et al. .......... 257/98 |
| 2010/0237379 A1* | 9/2010 | Kuo et al. ............. 257/99 |
| 2011/0006334 A1* | 1/2011 | Ishii et al. ............ 257/98 |

\* cited by examiner

SYSTEMS AND METHODS FOR MANAGING HEAT FROM AN LED

BACKGROUND OF THE INVENTION

1. Field of the Invention

The present embodiments relate generally to light-emitting devices, and particularly to light-emitting device assemblies that include light-emitting diodes (LEDs) as light sources. The methods and systems of at least some of the embodiments include those that increase the removal of thermal energy generated by the device. Embodiments relate to managing the heat produced by high-output LEDs, so as to maintain optimal output performance without causing damage to the LED.

2. Description of the Prior Art

A light-emitting diode (LED) can often provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights, to illuminate displays systems and so forth. Many technological advances have led to the development of high power LEDs by increasing the amount of light emission from such devices.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also generally include contact structures (also referred to as electrical contact structures or electrodes), which are features on a device that may be electrically connected to a power source. The power source can provide current to the device via the contact structures, e.g., the contact structures can deliver current along the lengths of structures to the surface of the device within which energy can be converted into light.

The layers of semiconductor material of the LED are typically disposed on a supporting base. In certain LEDs, a layer of dielectric material is disposed between the multiple layers of semiconductor material and a thermally conductive substrate of the supporting base, such that the semiconductor material layers of the LED are electrically isolated from the thermally conductive substrate.

In some high power light-emitting devices, problems may arise with managing the thermal energies generated by the light-emitting devices, which may decrease the lifespan of the device. Managing the heat produced by LEDs has been a growing concern as newer designs and materials have allowed for increased output and size of LEDs, which often translates into an increase in the amount of heat produced. Much of this is a result of being able to drive LEDs with more electrical current. At times, one of the limiting factors preventing an LED from producing more lumen output is that of controlling the temperature of the LED itself. High temperatures can lead to deterioration or ultimately inoperability. Thus, dissipating heat both quickly and with increased capacity will allow for such LEDs to maintain high output, efficiency, and reliability. Accordingly, light-emitting devices and systems that effectively dissipate heat can be beneficial.

Weaving carbon fiber into Fire retardant material 4 (FR-4) such as Stablcor's ST325, placing heat shields around a plurality of LEDs, and providing higher thermal conducting metal substrates are some of the means others have attempted to solve the above stated problem. See for example published U.S. patent Applications 2009/0010010 A1, 2008/0258162 A1, 2008/0057333 A1, 2008/0258157 A1, 2009/026483 A1 and 2007/0010086. Other prior art exhibit large leads exiting an insulating body surrounding a copper slug such as U.S. Pat. No. 7,321,161.

SUMMARY OF THE INVENTION

Systems for managing heat created by an LED are described.

In some embodiments a substrate is provided having a high thermal capacity such as copper or aluminum, a high-output LED which is electrically and thermally connected to the substrate, and a conductive pathway that is electrically coupled to the LED and electrically insulated from the substrate. Thus, forming a first-level surface mounting device without any leads. Generally silver epoxy or solder help couple the LED to the substrate because of their high thermal and electrical conductivity. The first level surface mounting may also have separated electrical paths on the bottom side of the substrate or non-LED side wherein the first-level surface mounting device can easily be coupled into a second-level surface mounting device.

The first-level surface mounting device may be attached to another substrate such as aluminum wherein the first substrate (copper, aluminum, etc) with a high thermal capacity and relatively high CTE will experience less stress as the matching substrate will have a comparable CTE, thus reducing the strain caused from CTE mismatching. The aluminum substrate may also have a receiving step designed to receive the first-level surface mounting device.

One way of preventing a short between the substrate and the conductive pathways connected to the LED is to form a hole in the first substrate, fill it with an electrically insulating medium (e.g., dielectric material), form another hole inside of the electrically insulating medium and pass a conductive pathway through to the underside of the substrate, wherein the conductive pathway remains isolated from the substrate.

An alternative method is that of etching paths in the substrate and filling the etched paths with a thermally conductive and electrically insulating medium (e.g., dielectric material), such that at least two areas of the substrate are electrically isolated from each other. Some times this etching process requires a height difference on the underside of the substrate wherein a receiving step on a second substrate would help in maintaining electrical isolation while maintaining high thermal conductivity, thus forming a second-level surface mounting device.

The second-level surface mounting device may then be further coupled to a heat dissipating device such as heat fins, a heat pipe that transports the heat to another heat dissipating region, and other such heat dissipating devices and systems well known in the art.

In some embodiments, a system for managing heat created from an LED is provided. The system comprises an LED and a substrate. The substrate are both thermally and electrically coupled to the LED. An electrically conductive pathway is connected to the LED. An electrically insulating medium separates the electrically conductive pathway from the substrate.

In some embodiments, a method for managing heat produced from an LED is provided. The method comprises electrically and thermally coupling a substrate to an LED, connecting an electrically conductive pathway to the LED; and electrically insulating the electrically conductive pathway from the substrate.

In some embodiments, a light-emitting package is provided. The package comprises an LED attached to a copper substrate having a thermal conductivity greater than 380 W/mK, wherein both an electrical and thermal connection exist between the copper substrate and the LED. The package further comprises an electrically conductive pathway, wherein the electrically conductive pathway is electrically coupled to the LED and electrically insulated from the copper substrate.

In some embodiments, a light-emitting package is provided. The package comprises an LED thermally and electrically attached to a substrate; and at least two electrically conductive pathways stemming from the LED, wherein a portion of the substrate forms a portion of at least one of the electrically conductive pathways.

In some embodiments, a light emitting-emitting package is provided. The package comprises an LED thermally and electrically attached to a first substrate, wherein isolated electrical pathways are formed through out the first substrate stemming from the LED to the underside of the first substrate, thus forming a surface mounting device devoid of externally protruding electrical leads. The package further comprises a receiving substrate that is electrically and thermally attached to the surface mounting device whereby maintaining isolation of the electrical pathways.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION OF THE PREFERRED EMBODIMENT

One or more embodiments presented herein include a light-emitting device assembly which has been configured to effectively transfer thermal energy generated by a light-emitting device (e.g., an LED) through a substrate (e.g., a copper base) and ultimately to the surroundings, which may include an external heat sink. Such an assembly can include an LED, a substrate, and a conductive pathway through the substrate forming a first-level surface mounting device (SMD). Surface mounting devices can be directly mounted to the surface of an electronic PCB board, substrates, and other such surfaces.

The LED within this first-level SMD can be electrically and thermally coupled to the substrate. This coupling may be formed by direct contact or via an additional electrically and thermally conductive material. The substrate may contain additional electrical pathways that are isolated from the substrate using an electrically insulating medium (e.g., dielectric material). Alternatively, the first level SMD may also be further combined electrically and thermally with a second substrate or base forming a second-level SMD, which in turn can facilitate optimum thermal communication between the LED and eventually a heat dissipating device such as heat fins or additional heat transfer devices such as a heat pipe. The assembly can increase the overall heat removal created by the LED device. This is particularly useful with high-output LEDs.

Figure 1:
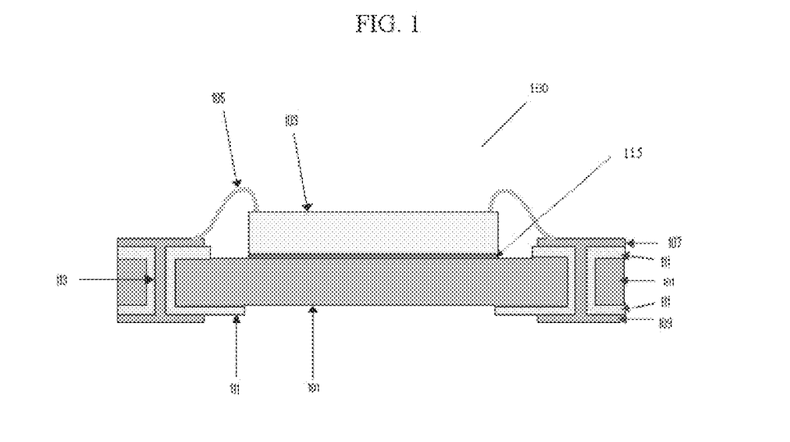
FIG. 1 is a side view schematic of a representative first-level light-emitting assembly in accordance with a direct via embodiment.

FIG. 1 shows a side view schematic representative of an embodiment of a first-level light-emitting assembly 100. A light-emitting device such as an LED 103, is coupled to substrate 101, both electrically and thermally. The coupling may be through direct contact with a surface of the LED 103 and a surface of the substrate 101 or, as shown, one or more electrically and thermally conductive layer(s) 115 may be disposed between 101 and 103. Layer 115 may be comprised of a silver epoxy, solder or similar materials that bind together LED 103 and substrate 101. Layer 115 should be composed of such material that the thermal communication between LED 103 and substrate 101 is optimized.

Ideally, the substrate 101 is comprised of a material having a high thermal conductivity such as copper or aluminum. The thermal communication between LED 103 and the substrate 101 can have a minimum thermal conductivity of greater than about 25 W/m*K, greater than about 50 W/m*K, greater than about 100 W/m*K, or greater than about 200 W/m*K (e.g. about 400 W/m*K), thus increasing heat removal from the light-emitting device via the substrate 101.

The substrate 101 may also be electrically conductive. An electrically conductive pathway in this particular embodiment is shown starting at the LED 103, passing through electrical wire bonds 105, electrical traces 107, an electrical via 113, and an electrical trace 109 on the under side of the substrate 101. The electrically conductive pathway is isolated from the substrate 101 at various points with an electrically insulating medium (e.g., dielectric material) 111. For this particular embodiment, at least one hole is created between the top and bottom surfaces of substrate 101, filled or coated partially with an electrically insulating medium sufficient to isolate an electrical via 113 passing through the inner portion of the electrically insulating medium inside the hole. Electrically insulating medium 111 may also be used on selective areas on the top and bottom surfaces of substrate 101 to create isolation from electrical traces 107 and 109. Though this embodiment is shown with electrical traces 107 and 109 being supported on substrate 101 by electrically insulating medium 111, an alternative would be to directly connect wire bond 105 to electrical via 113. Additionally, it can also be appreciated that an electrically conductive pathway does not have to go straight through substrate 101 such as in the form of a hole with an electrical via as shown. Portions of substrate 101 can be electrically isolated from each other (not shown), thus creating an electrically conductive pathway stemming from LED 103 on the top side of substrate 101 to the bottom or opposite side as the attached LED 103. These embodiments thus form a first level light-emitting assembly or surface mounting device. Such a first-level surface mounting device can then be easily attached, mounted or coupled into a second-level surface mounting device, PCB, metal core PCB, or a heat dissipating device. The distinct and separated electrical contacts or surfaces on the underside of the first level light-emitting assembly 100 allow for such connection.

In alternative embodiments, the electrically insulating medium (e.g., dielectric material) should also be configured to allow a maximum amount of heat to flow from LED 103 through substrate 101. Such configurations could include minimizing the amount of electrically insulating medium directly below the footprint or surface area of LED 103 as well as minimizing the amount and thickness of the material. Particularly, allowing the substrate, which generally will have a higher thermal conductivity to spread and dissipate heat dispensed from the LED. Thus, when the heat flux passes through the electrically insulating medium the increased thermal resistivity of the electrically insulating medium will have minimized effects.

Figure 2:
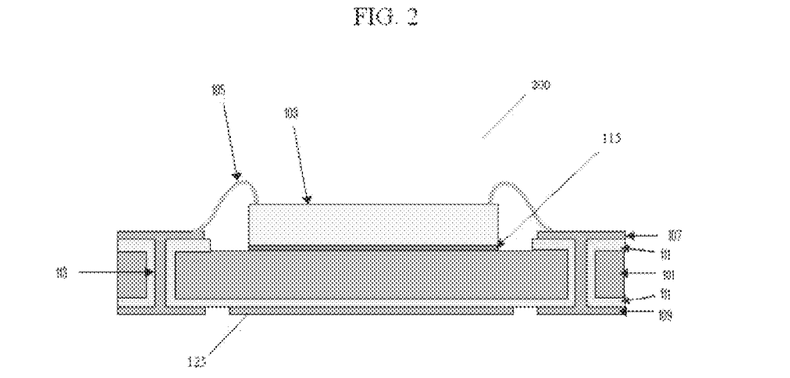
FIG. 2 is a side view schematic of a representative light-emitting assembly in accordance with another embodiment.

FIG. 2 shows a side view schematic representative of another embodiment of a first-level light-emitting assembly 200. In this embodiment, LED 103 again is coupled to substrate 101, by a thermally and electrically conductive layer 115. As with the embodiment shown in FIG. 1, the thermal communication between the LED 103 and the substrate 101 can have a minimum thermal conductivity of greater than about 25 W/m*K, greater than about 50 W/m*K, greater than about 100 W/m*K, or greater than about 200 W/m*K (e.g. about 400 W/m*K), thus increasing heat removal from the LED 103 via the substrate 101. Furthermore, the LED may have a CTE of approximately 6 ppm/° C., while the CTE of the substrate may range from 2 to 25 ppm/° C. A copper substrate generally has a CTE of approximately 17 ppm/° C.

As previously mentioned, this particular embodiment shows an electrically insulating medium (e.g., dielectric layer) 111 along the bottom surface of substrate 101 with an additional thermally and electrically conductive layer 125 beneath 111 such as copper or other highly conductive material that will act as a connector for the next level, board, system the light-emitting assembly 200 will be attached to. The continuous electrically insulating medium 111 along with the thermally and electrically conductive layer 125 allow for a more coplanar surface along the bottom of light-emitting assembly 200. Unlike light-emitting assembly 100, as previously described, light-emitting assembly 200, allows for a receiving substrate to also be coplanar rather than having one with a pedestal to be described in FIG. 3. Also, as previously mentioned, the electrically insulating medium is removed from a further from the heat source where the system can afford the increase in thermal resistance due in part by the dissipation of the heat throughout substrate 101.

Figure 3:
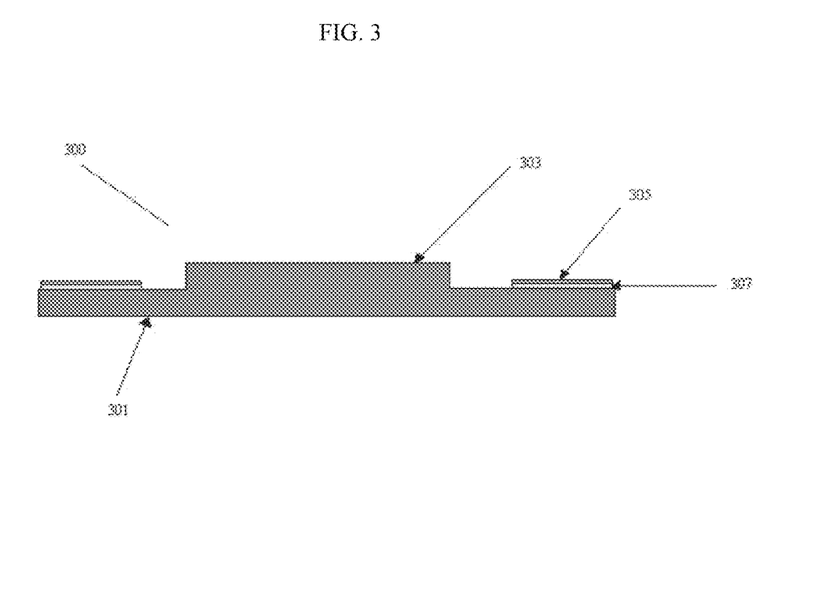
FIG. 3 is a side view schematic of a representative receiving substrate having a pedestal.

FIG. 3 is a side view schematic of a representative receiving substrate 300. The receiving substrate 300 is comprised of a substrate 301, a receiving step 303, electrically insulating medium (e.g., dielectric layers) 307, and electrical traces 305. This particular receiving substrate is designed to receive the first-level light-emitting device assemblies 100. Substrate 301 is comprised of a high thermally conductive material such as copper or aluminum wherein the thermal communication between substrate 101 and 301 are greater than about 25 W/m*K, greater than about 50 W/m*K, greater than about 100 W/m*K, or greater than about 200 W/m*K, thus increasing heat removal from the LED 103 via the substrates 101 and 301. The thermal conductivity of substrate 301 need not be as high as that of substrate 101, because the vector profile of heat produced by LED 103 will have become more spread out through substrate 101 as the surface area of substrate 101 is generally larger than the surface area of LED 103. Though the heat intensity per surface area will be lower as received from substrate 101 than LED 103 it is important the thermal conductivity of substrate 301 remain sufficiently high, so as to maintain optimal thermal communication with LED 103 by reducing thermal resistivity. This also becomes more important as additional LEDs are added to the light-emitting assemblies. Receiving substrate 300 may be formed by a number of methods known in the art such as punching, milling, etching, and so forth.

Figure 4:
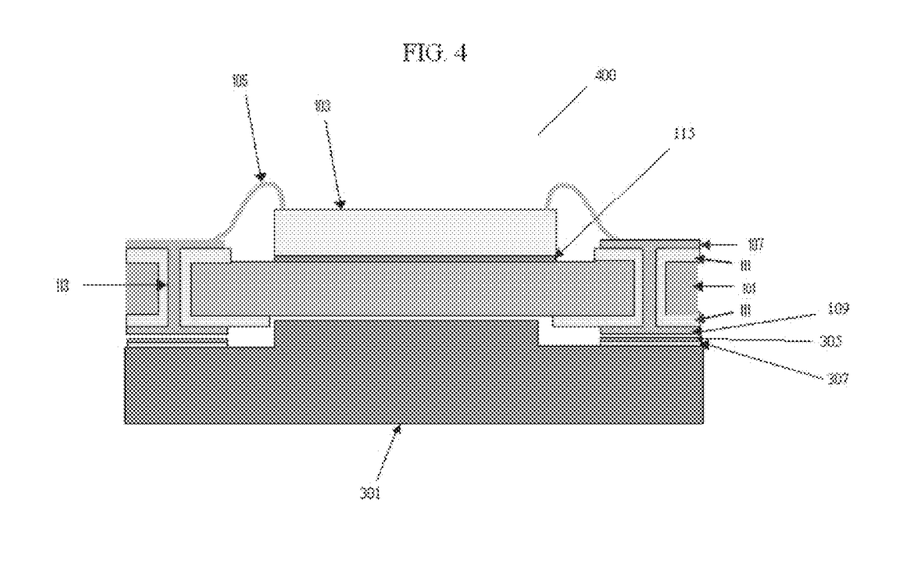
FIG. 4 is a side view schematic representative of a second-level light-emitting assembly.

FIG. 4 shows a side schematic representative of a second-level light-emitting assembly 400 including incorporating first-level light-emitting assembly 100 with receiving substrate 300. The incorporation may include direct contact methods as well as binding the second-level light-emitting assembly together using a binder such as layer 115 (not shown in FIG. 4). It should be realized that the figure is drawn for illustrative purposes only and that the optimization of thermal communication and thermal dissipation is geometrically constrained as well as by material properties. One skilled in the art would immediately recognize increasing the surface area connection between substrates 101 and 301 will aide in this optimization. As mentioned, electrically insulating mediums 307 and 111 may also be optimized to conduct heat. Like the first-level light emitting assembly 100, this second-level light emitting assembly 400 can then be further incorporated into another system or attached to a heat dissipating device such as heat fins. Heat pipes (not shown) may also be attached to 400 and further the transfer of heat. 400 allows for continued electrical connectivity to a power source as well.

Figure 5:
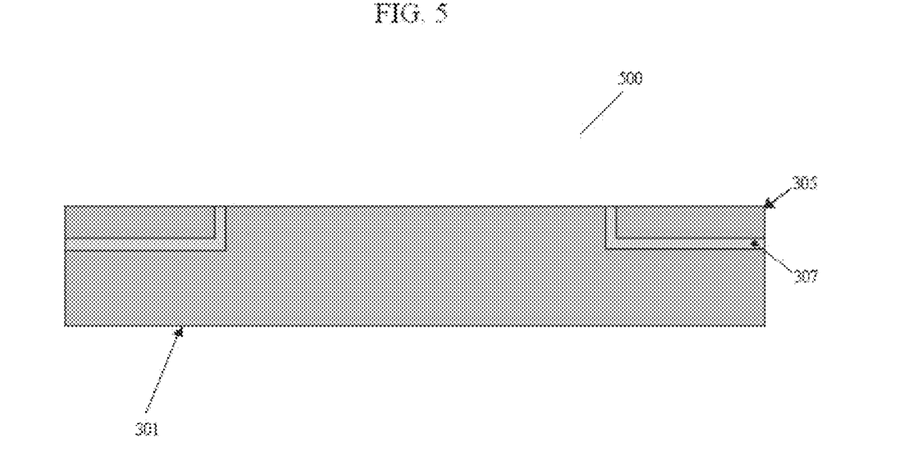
FIG. 5 is a side view schematic representative of a receiving substrate that is co-planar.

FIG. 5 is a side view schematic representative of receiving substrate 500 that is co-planar along the top surface. Like receiving substrate 300, 500 is comprised of a substrate 301, electrically insulating medium (e.g., dielectric layers) 307, and electrical traces 305. This particular receiving substrate is designed to receive first-level light-emitting device assemblies representative by first-level light emitting assembly 200, that have a coplanar bottom surface. As mentioned, substrate 301 is comprised of a high thermally conductive material such as copper or aluminum wherein the thermal communication between substrate 101 and 301 are greater than about 25 W/m*K, greater than about 50 W/m*K, greater than about 100 W/m*K, or greater than about 200

W/m*K, thus increasing heat removal from the LED 103 via the substrates 101 and 301. The thermal conductivity of substrate 301 need not be as high as that of substrate 101, because the vector profile of heat produced by LED 103 will have become more spread out through substrate 101 as the surface area of substrate 101 is generally larger than the surface area of LED 103. Though the heat intensity per surface area will be lower as received from substrate 101 than LED 103 it is important the thermal conductivity of substrate 301 remain sufficiently high, so as to maintain optimal thermal communication with LED 103 by reducing thermal resistivity. This also becomes more important as additional LEDs are added to the light-emitting assemblies. Receiving substrate 500 may be formed by a number of methods known in the art such as punching, milling, etching, and so forth. Receiving substrate 500 may also be configured or adapted to receive a plurality of electrical conductive pathways; particularly, as the number of LED sources increase or as the number of first-level light emitting assemblies increases. It may also be appreciated that various plating techniques or oxidizing techniques such as using Nickel/Silver and Nickel/Gold aide in increasing the connectivity between the electrically conductive pathways and substrates that are well known in the art.

One of the advantages of using high thermally conductive materials for substrates 101, 301 and even for part of LED 103 is for the coefficient of thermal expansion properties. The closer the difference of CTE properties between substrates 101, 301 and LED 103 the less strain that exists between the boundary layers. This reduced strain will help increase the longevity of the product.

Figure 6:
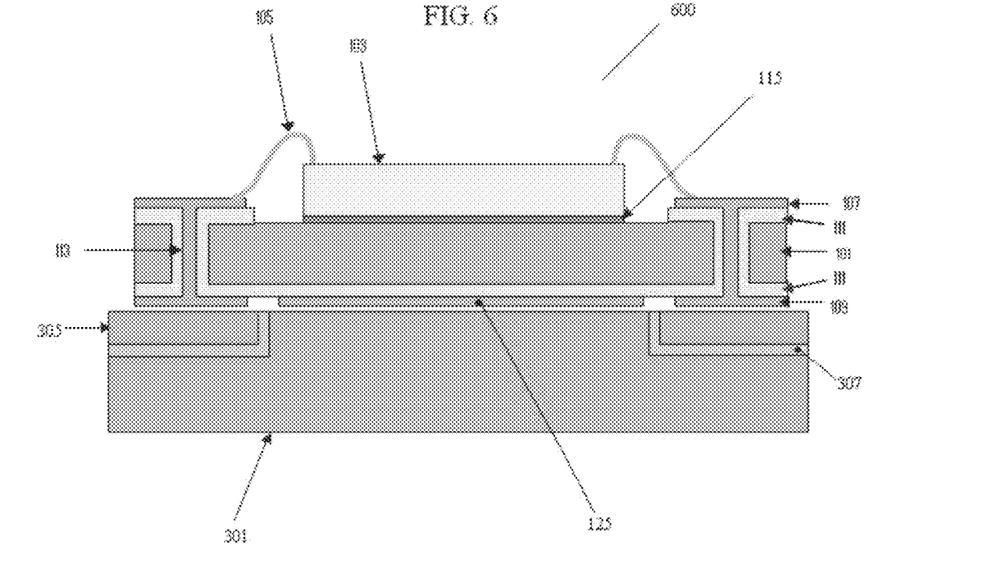
FIG. 6 is a side view schematic representative of another embodiment of a second-level light-emitting assembly.

FIG. 6 is a side view schematic representative of an embodiment of a second-level light-emitting assembly 600 incorporating a co-planar receiving substrate such as one shown in FIG. 5.

Figure 7:
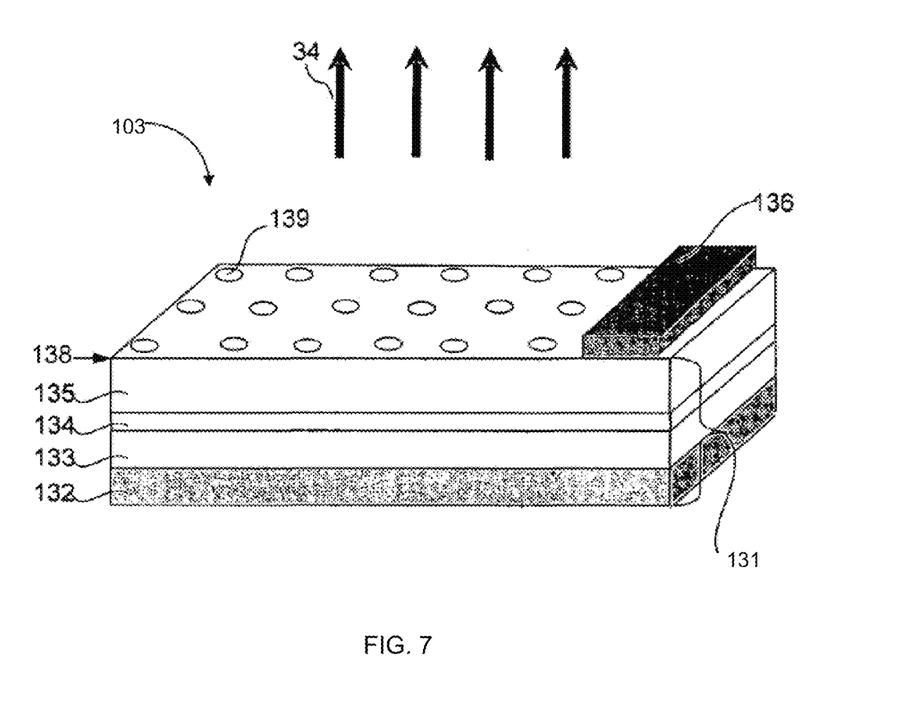
FIG. 7 illustrates an LED die that may be the light-generating component of the light-emitting assembly.
Figure 8:
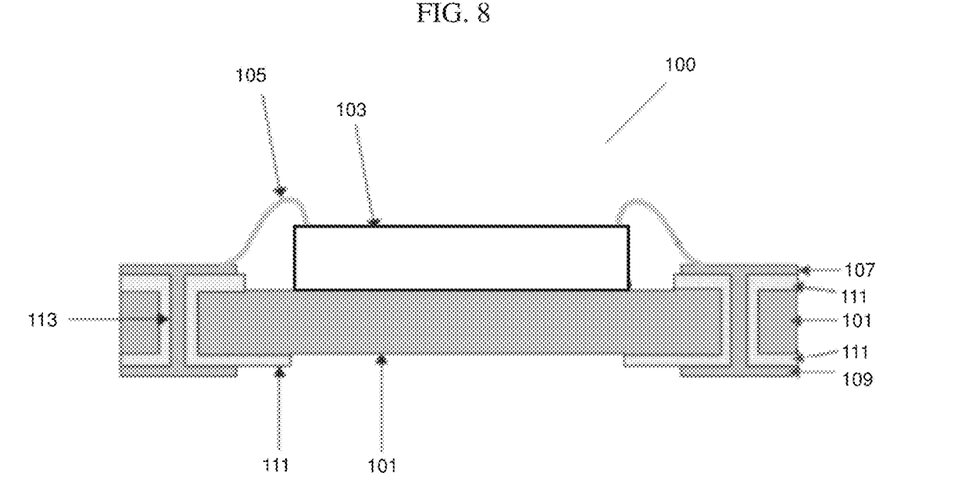
FIG. 8 is a side view schematic of a representative light-emitting assembly in accordance with another embodiment.

FIG. 7 illustrates an LED die that may be the light-generating component of the light-emitting device, in accordance with one embodiment. It should also be understood that various embodiments presented herein can also be applied to other light-emitting devices, such as laser diodes, and LEDs having different structures. The LED 103 shown in FIG. 7 comprises a multi-layer stack 131 that may be disposed on substrate 101 as shown in FIG. 1. The multi-layer stack 131 can include an active region 134 which is formed between n-doped layer(s) 135 and p-doped layer (s) 133. The stack can also include an electrically conductive layer 132 which may serve as a p-side contact, which can also serve as an optically reflective layer. An n-side contact pad 136 is disposed on layer 135. It should be appreciated that the LED is not limited to the configuration shown in FIG. 7, for example, the n-doped and p-doped sides may be interchanged so as to form an LED having a p-doped region in contact with the contact pad 136 and an n-doped region in contact with layer 132. As described further below, electrical potential may be applied to the contact pads which can result in light generation within active region 134 and emission of at least some of the light generated through an emission surface 138. As described further below, openings 139 may be defined in a light-emitting interface (e.g., emission surface 138) to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 135 can include a silicon-doped GaN layer (e.g., having a thickness of about 4000 nm thick) and/or the p-doped layer(s) 133 include a magnesium-doped GaN layer (e.g., having a thickness of about 40 nm thick). The electrically conductive layer 132 may be a silver layer (e.g., having a thickness of about 100 nm), which may also serve as a reflective layer (e.g., that reflects upwards any downward propagating light generated by the active region 134). Furthermore, although not shown, other layers may also be included in the LED; for example, an AlGaN layer may be disposed between the active region 134 and the p-doped layer(s) 133. It should be understood that compositions other than those described herein may also be suitable for the layers of the LED.

As a result of openings 139, the LED can have a dielectric function that varies spatially according to a pattern which can influence the extraction efficiency and/or collimation of light emitted by the LED. In the illustrative LED 103, the pattern is formed of openings, but it should be appreciated that the variation of the dielectric function at an interface need not necessarily result from openings. Any suitable way of producing a variation in dielectric function according to a pattern may be used. For example, the pattern may be formed by varying the composition of layer 135 and/or emission surface 138. The pattern may be periodic (e.g., having a simple repeat cell, or having a complex repeat super-cell), periodic with de-tuning, or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns.

In some embodiments, a complex periodic pattern can have certain openings with one diameter and other openings with a smaller diameter. As referred to herein, a non-periodic pattern is a pattern that has no translational symmetry over a unit cell that has a length that is at least 50 times the peak wavelength of light generated by active region 134. Examples of non-periodic patterns include aperiodic patterns, quasi-crystalline patterns, Robinson patterns, and Amman patterns.

In certain embodiments, an interface of a lightemitting device is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety. A high extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. patent application Ser. No. 11/370,220, entitled "Patterned Devices and Related Methods," filed on Mar. 7, 2006, which is herein incorporated by reference in its entirety.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned interface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 flm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total power divided by the emission area. In some embodiments, the total power flux is greater than 0.03 Watts/mm2, greater than 0.05 Watts/mm2, greater than 0.1 Watts/mm2, or greater than 0.2 Watts/mm2. However, it should be understood that the LEDs used in systems and methods presented herein are not limited to the above described power and power flux values.

In some embodiments, the LED may be associated with a wavelength-converting region (not shown). The wavelength-converting region may be, for example, a phosphor region. The wavelength-converting region can absorb light emitted by the light-generating region of the LED and emit light having a different wavelength than that absorbed. In this manner, LEDs can emit light of wavelength(s) (and, thus, color) that may not be readily obtainable from LEDs that do not include wavelength-converting regions.

As used herein, an LED may be an LED die, a partially packaged LED die, or a fully packaged LED die. It should be understood that an LED may include two or more LED dies associated with one another, for example a redlight emitting LED die, a green-light emitting LED die, a blue-light emitting LED die, a cyan-light emitting LED die, or a yellow-light emitting LED die. For example, the two or more associated LED dies may be mounted on a common package. The two or more LED dies may be associated such that their respective light emissions may be combined to produce a desired spectral emission. The two or more LED dies may also be electrically associated with one another (e.g., connected to a common ground).

When a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

The above description is merely illustrative. Having thus described several aspects of at least one embodiment of this invention including the preferred embodiments, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for managing heat created from an LED comprising:
   an LED;
   a substrate, wherein the substrate is both thermally and electrically coupled to the LED;
   an electrically conductive pathway connected to the LED; and
   a first electrically insulating medium separating the electrically conductive pathway from the substrate; wherein the LED, the substrate, the electrically conductive pathway, and the first electrically insulating medium form a first-level surface mounting device; and
   a receiving substrate comprised of, at least in part, copper or aluminum and thermally coupled to the first-level surface mounting device, the receiving substrate including electrical traces that are electrically connected to the electrically conductive pathway, the receiving substrate including a second electrically insulating medium separating the electrical traces from the copper or the aluminum of the receiving substrate.

2. The system of claim 1, wherein the substrate has a thermal conductivity greater than 380 W/mK.

3. The system of claim 1, wherein the first-level surface mounting device is devoid of externally protruding electrical leads.

4. The system of claim 1, wherein the CTE strain differential between the LED and the substrate is less than 12 ppm/° C.

5. The system of claim 1, wherein the electrically conductive pathway passes through the top and bottom surfaces of the substrate.

6. The system of claim 1, further including a plurality of electrically conductive pathways coupled to the substrate.

7. The system of claim 1, wherein the substrate is a copper material.

8. The system of claim 6, wherein some of the plurality of electrically conductive pathways are insulated from the substrate.

9. The system of claim 8, wherein some of the plurality of electrically conductive pathways are coupled to the top surface of the substrate.

10. The system of claim 8, wherein some of the plurality of electrically conductive pathways are coupled to the bottom surface of the substrate.

11. The system of claim 1, wherein the receiving substrate has a thermal conductivity greater than 200 W/mK.

12. The system of claim 1], wherein the CTE of the receiving substrate is greater than 20 ppm/° C.

13. The system of claim 1, wherein the CTE strain differential between the surface mounting device and the receiving substrate is less than 8 ppm/° C.

14. The system of claim 1, wherein the receiving substrate and the surface mounting device form a second level mounting device.

15. The system of claim 1, wherein the surface mounting device and the receiving substrate are coupled by solder.

* * * * *